United States Patent
Sloey

(10) Patent No.: US 9,033,739 B2
(45) Date of Patent: May 19, 2015

(54) TECHNIQUES FOR SHIELDING CONNECTORS THAT ALLOW FOR CONFORMAL COATING AGAINST CORROSION

(75) Inventor: Jason S. Sloey, Cedar Park, TX (US)

(73) Assignee: Apple Inc., Cupertino, CA (US)

( * ) Notice: Subject to any disclaimer, the term of this patent is extended or adjusted under 35 U.S.C. 154(b) by 85 days.

(21) Appl. No.: 13/608,332

(22) Filed: Sep. 10, 2012

(65) Prior Publication Data

US 2013/0242475 A1    Sep. 19, 2013

Related U.S. Application Data

(60) Provisional application No. 61/532,651, filed on Sep. 9, 2011.

(51) Int. Cl.
| | |
|---|---|
| *H01R 12/00* | (2006.01) |
| *H01R 13/6461* | (2011.01) |
| *H01R 13/52* | (2006.01) |
| *H01R 13/46* | (2006.01) |
| *H05K 7/02* | (2006.01) |
| *G06F 1/16* | (2006.01) |
| *H01R 13/6594* | (2011.01) |
| *H04M 1/02* | (2006.01) |

(52) U.S. Cl.
CPC ........ *H01R 13/6461* (2013.01); *H01R 13/5219* (2013.01); *H01R 13/465* (2013.01); *H05K 7/02* (2013.01); *H01R 13/5202* (2013.01); *H01R 13/6594* (2013.01); *H04M 1/0274* (2013.01); *G06F 1/1658* (2013.01); *Y10S 439/936* (2013.01)

(58) Field of Classification Search
CPC .......... H01R 13/6461; H01R 13/5202; H01R 13/465; H01R 13/5219; H05K 7/02
USPC ................... 439/79, 607.35–607.4, 589, 936
See application file for complete search history.

(56) References Cited

U.S. PATENT DOCUMENTS

| | | | | |
|---|---|---|---|---|
| 7,607,925 | B2 * | 10/2009 | Chuang ........................... | 439/79 |
| 7,661,991 | B1 * | 2/2010 | Sun ........................... | 439/607.55 |
| 7,833,025 | B2 * | 11/2010 | Voli et al. ...................... | 439/76.1 |
| 7,922,535 | B1 * | 4/2011 | Jiang et al. ............... | 439/607.35 |
| 8,801,467 | B2 * | 8/2014 | Lan ........................... | 439/607.36 |

\* cited by examiner

*Primary Examiner* — Khiem Nguyen
(74) *Attorney, Agent, or Firm* — Kilpatrick Townsend & Stockton LLP

(57) ABSTRACT

An electronic device including a connector. The connector includes a housing defining a cavity for receiving a mating connector. The housing includes a contact support member. The connector also includes contacts supported by the contact support member, the contacts including protruding portions that protrude outside of the cavity. The connector may also include a shielding element disposed over the protruding portion of at least some of the contacts. A moisture sealant may be disposed within a gap located between the contacts and the shielding element. In one embodiment, a cap may be provided between the housing and the shielding. The cap and the housing may each include an aperture for viewing a moisture indicator, and at least one of the cap and the housing may include cutouts for holding a transparent element.

20 Claims, 12 Drawing Sheets

TECHNIQUES FOR SHIELDING CONNECTORS THAT ALLOW FOR CONFORMAL COATING AGAINST CORROSION

CROSS-REFERENCES TO RELATED APPLICATIONS

This application claims the benefit of U.S. Provisional Patent Application No. 61/532,651, filed Sep. 9, 2011, and entitled "ELECTRICAL CONNECTOR," which is incorporated herein by reference in its entirety for all purposes.

BACKGROUND

Embodiments of the present invention relate to a receptacle (female) or plug (male) connector. More particularly, embodiments of the present invention relate to a connector with EMI or other interference shielding and/or a moisture infiltration indication system that may be incorporated into electronic devices, cables for connecting electronic devices, etc.

Numerous types of electrical connectors for interconnecting electronic devices exist in the art. Such connectors typically include two connectors that may mate with one another, such as a receptacle connector and a plug connector. The plug connector may engage the receptacle connector for establishing an electrical connection between pin-shaped contacts arranged in each connector. The connectors may be used in a variety of products. For example, a cable may have both a receptacle connector and a plug connector located at opposite ends of the cable. For another example, an electronic device may include one or more of a receptacle connector and a plug connector.

With increasing speeds of data being communicated via the contacts, the susceptibility of the data being communicated over the contacts to errors due to electromagnetic or other types of radiation received at the connector is also increasing. Similarly, with the increasing density and complexity of electronic devices to which connectors are embedded, the susceptibility of other components of the electronic devices to error as a result of electromagnetic radiation emitted from the connector is also increasing.

Further, electronic devices (and sometimes cables) are often highly sensitive to moisture. A common destructive point of entry for moisture into the device (or cable) is often at the connector since the contacts typically provide a direct path to moisture-sensitive circuitry located within the device. Although electronic devices are highly sensitive to moisture infiltration, it is difficult to determine, after a device becomes inoperable, whether the device failure is due to moisture infiltration or some other reason. It is often important to determine whether the device failure is due to moisture infiltration as such a cause of failure may render a manufacturer's warranty void.

It would therefore be desirable to provide connectors (male or female, provided in electronic devices or elsewhere) that reduce electromagnetic interference (EMI) and/or other types of interference, increase the resilience of the device or cable to moisture exposure, and provide an ability to detect moisture infiltration.

SUMMARY

Embodiments of the present invention generally concern connectors, where the connector may be included in a portable electronic device. The connector may include a housing that defines a cavity for receiving a mating connector (e.g., where the connector is a male connector, the housing may define a cavity for receiving a female connector, and where the connector is a female connector, the housing may define a cavity for receiving a male connector). The housing may also include a tongue that protrudes into the cavity. The connector may also include a plurality of contacts for establishing communications with corresponding contacts of the mating connector. The contacts may be operable to communicate electrical, optical, or other types of signals. The contacts may include a portion that is supported by the tongue and physically contact the corresponding contacts of the mating connector when the connectors are engaged with one another. The contacts may include another portion that extends outside of the cavity and which may be bonded to a printed circuit board of the electronic device, or may be bonded to wires bound together in a cable.

In some embodiments, the connector may also include a shielding element extending entirely over only some of the contact portions that extend outside of the cavity. By extending entirely over some of the contact portions, an amount of electromagnetic or other types of radiation emitted from and induced onto the contacts may advantageously be reduced. Further, by not extending over some of the contact portions, a liquid moisture sealant may advantageously be wicked up a gap located between the pins and the shielding element so as to subsequently prevent ingress of moisture from the cavity defined by the housing into the electronic device or cable.

In one embodiment, the connector may include a cap arranged between the housing and the shielding element. The cap may advantageously electrically insulate the contacts from the shielding element, and may prevent moisture ingress.

In another embodiment, the connector may include a channel disposed proximate to the tongue of the housing. The channel may extend along at least some portions of the housing in the same direction in which the pins are arranged in the housing. By providing such a channel, when liquid moisture sealant is wicked into a gap located between the contacts and the shielding element, excess amounts of liquid moisture sealant may advantageously be wicked into the channel rather than onto a portion of the contact extending along the tongue of the housing.

For a fuller understanding of the nature and advantages of embodiments of the present invention, reference should be made to the ensuing detailed description and accompanying drawings. Other aspects, objects and advantages of the invention will be apparent from the drawings and detailed description that follows. However, the scope of the invention will be fully apparent from the recitations of the claims.

DETAILED DESCRIPTION

Embodiments of the invention are discussed below with reference to FIGS. 1A to 6F. However, those skilled in the art will readily appreciate that the detailed description given herein with respect to these figures is for explanatory purposes only as embodiments of the invention extend beyond these limited embodiments.

Figure 1A:
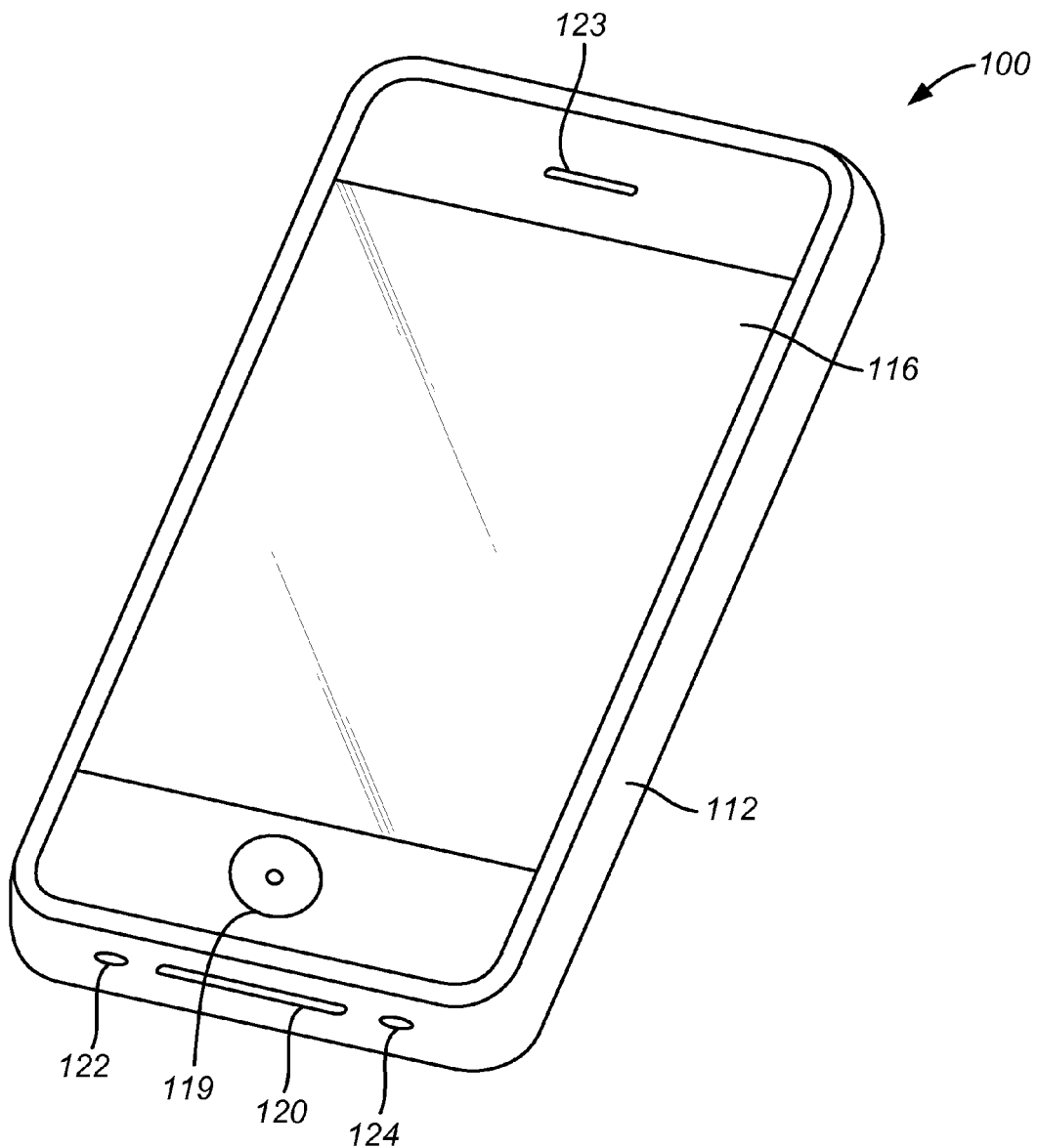
FIG. 1A is a perspective view of a portable electronic device in accordance with an embodiment of the present invention.

FIG. 1A is a perspective view of an electronic device 100 in accordance with an embodiment of the present invention.

Device 100 may be any suitable electronic device having an electrical connector. For example, device 100 may be a cellular phone, a media player (e.g., music player and/or video player), a personal digital assistant (PDA), a camera, a game player, a remote control, a global positioning system (GPS), a laptop computer, a netbook, a booklet, a slate, a convertible notebook, etc. In some embodiments, device 100 may be a hybrid of one or more of the aforementioned devices (such as a combination GPS and cellular phone). In one embodiment, device 100 may be cable having an electrical connector. For example, device 100 may be a cable having one or more wires, where one or more of the wires may be individually insulated and bundled together within an additional insulating sheath. One or more of the wires may be bonded (e.g., soldered) to the electrical connector, and the insulating sheath may also surround portions of the electrical connector.

Electronic device 100 as shown in FIG. 1A includes a housing 112. Housing 112, which is sometimes referred to as a case, may be formed of any suitable materials including, plastic, glass, ceramics, metal, or other suitable materials, or a combination of these materials. Device 100 may also have a display 116. Display 116 may be a liquid crystal diode (LCD) display, an organic light emitting diode (OLED) display, or any other suitable display. The outermost surface of display 116 may be formed from one or more plastic or glass layers. If desired, touch screen functionality may be integrated into display 116 or may be provided using a separate touch pad device.

Device 100 may include input-output devices in addition or alternatively to display 116. For example, electronic device 100 may have user input control devices such as button 119, and input-output components such as receptacle connector 120 and one or more input-output jacks (e.g., for audio and/or video). Openings 122 and 124 may, if desired, form speaker and microphone ports. Opening 123 may also form a speaker port.

Receptacle connector 120, which may sometimes be referred to as a port, dock connector, 30-pin data port connector, input-output port, or bus connector, may be used as an input-output port (e.g., when connecting device 100 to a mating dock connected to a computer or other electronic device). Receptacle connector 120 may contain pins for receiving data and power signals. Receptacle connector 120 may include power pins to recharge a battery within device 100 or to operate device 100 from a direct current (DC) power supply, data pins to exchange data with external components such as a personal computer or peripheral, audio-visual jacks to drive headphones, a monitor, or other external audio-video equipment, a subscriber identity module (SIM) card port to authorize cellular telephone service, a memory card slot, etc.

Figure 1B:
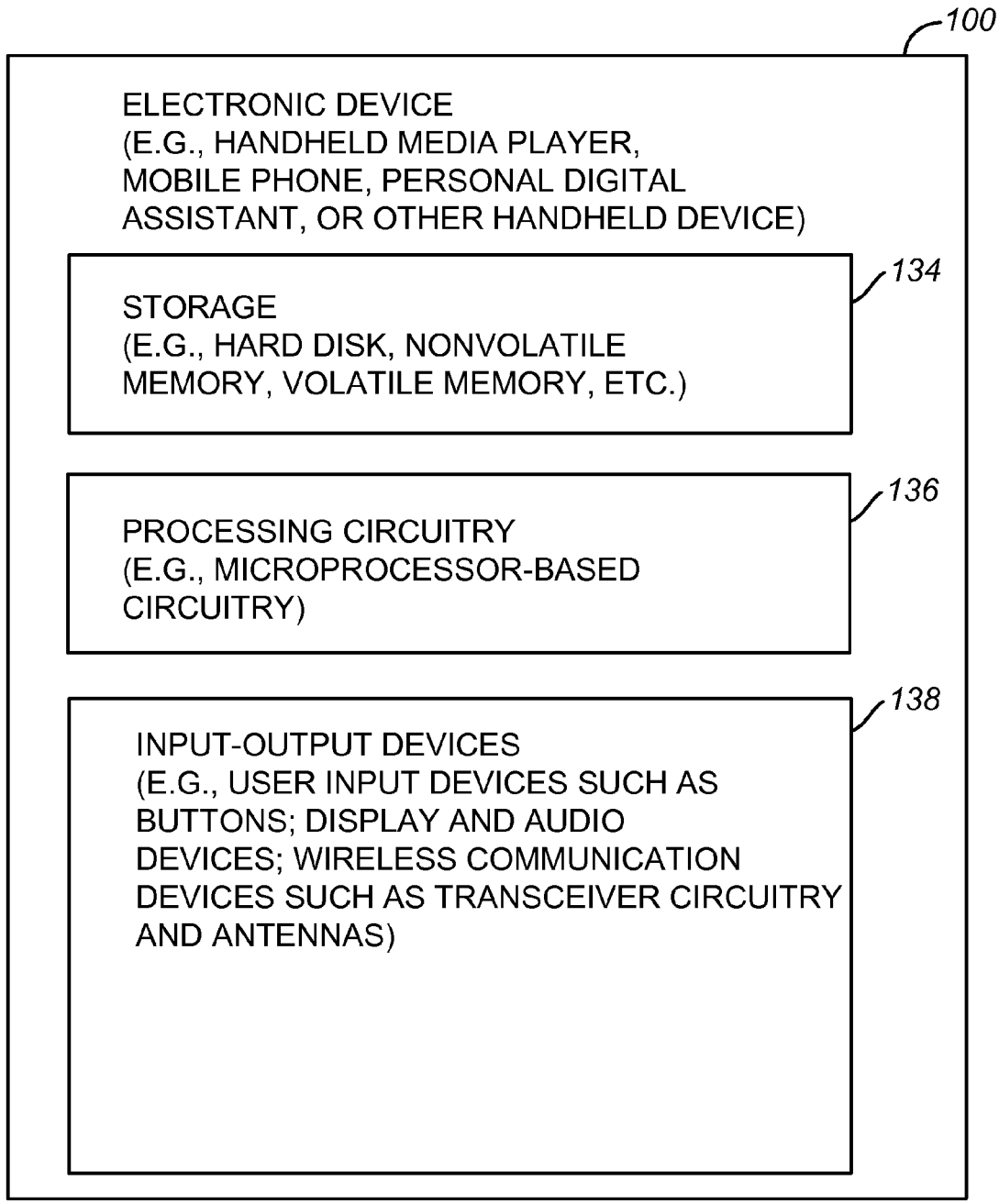
FIG. 1B is a schematic diagram of the portable electronic device of FIG. 1A.

FIG. 1B is a schematic diagram of the portable electronic device 100 of FIG. 1A. As shown in FIG. 1B, device 100 may include storage 134. Storage 134 may include one or more different types of storage such as hard disk drive storage, nonvolatile memory (e.g., flash memory or other electrically-programmable-read-only memory), volatile memory (e.g., battery-based static or dynamic random-access-memory), etc.

Device 100 may also include processing circuitry 136, which may be used to control the operation of device 100. Processing circuitry 136 may be based on a processor such as a microprocessor and other suitable integrated circuits. With one suitable arrangement, processing circuitry 136 and storage 134 are used to run software on device 100, such as internet browsing applications, voice-over-internet-protocol (VOIP) telephone call applications, email applications, media playback applications, operating system functions, etc.

Processing circuitry 136 and storage 134 may be used in implementing suitable communications protocols, such as internet protocols, wireless local area network protocols (e.g., IEEE 802.11 protocols—sometimes referred to as Wi-Fi.RTM.), etc.

Device 100 may also include input-output devices 138, which may be used to allow data to be supplied to device 100 and to allow data to be provided from device 100 to external devices. Display 116, button 119, microphone port 124, speaker port 122, and receptacle connector 120 are examples of input-output devices 138. Other input-output devices 138 may include user input-output devices such as buttons, touch screens, joysticks, click wheels, scrolling wheels, touch pads, key pads, keyboards, microphones, cameras, etc; display devices such as liquid-crystal display (LCD) screens or other screens, light-emitting diodes (LEDs), and other components that present visual information and status data; audio devices such as speakers and other devices for creating sound; and wireless communications devices such as radio-frequency (RF) transceiver circuitry, power amplifier circuitry, passive RF components, antennas, and other circuitry for handling RF wireless signals, etc.

Figure 1C:
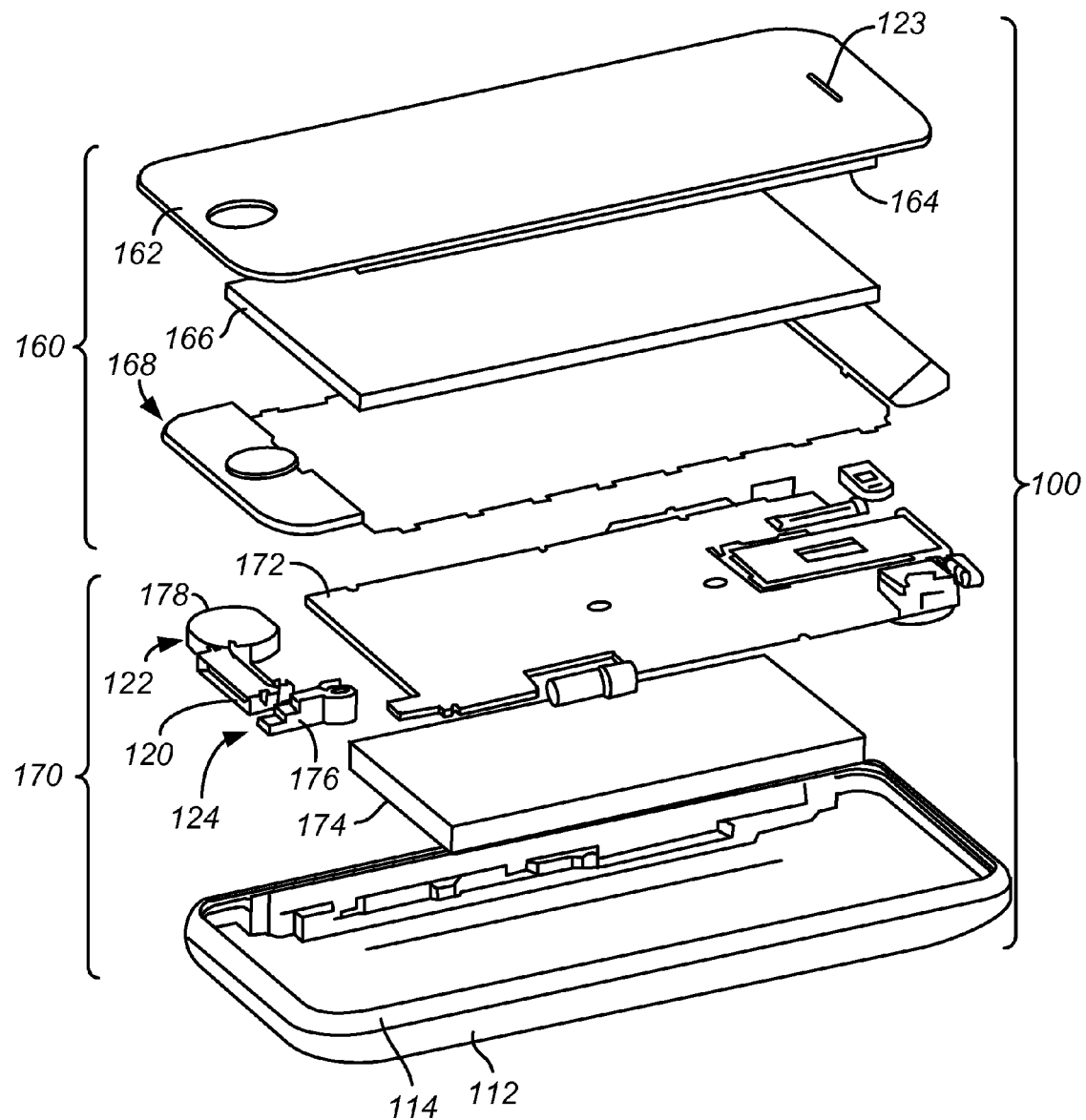
FIG. 1C is an exploded perspective view showing components of the portable electronic device of FIG. 1A.

FIG. 1C is an exploded perspective view showing components of the portable electronic device 100 of FIG. 1A. Assembly portion 160 (shown in its unassembled state in FIG. 1C) may include components such as cover 162, touch sensitive sensor 164, display unit 166, and frame 168. Cover 162 may be formed of glass or other suitable transparent materials (e.g., plastic, combinations of one or more glasses and one or more plastics, etc.). Display unit 166 may be, for example, a color liquid crystal display.

Assembly portion 170 (shown in its unassembled state in FIG. 1C) may include housing 112. Housing 112 may be formed of plastic and/or other materials such as metal (e.g., metal alloys). Assembly portion 170 may also include one or more printed circuit boards such as printed circuit board (PCB) 172. Assembly portion 170 may also include components such as microphone 176 for microphone port 124, speaker 178 for speaker port 122, and receptacle connector 120, integrated circuits, a camera, ear speaker for port 123, audio jack, buttons, SIM card slot, etc.

Device 100 contains numerous electronic components such as PCB 172, integrated circuits (ICs) mounted on PCB 172, display unit 166, touch sensor 164, a camera, etc. Various electronic components of device 100 are located in a close proximity to receptacle connector 120, and thus in a close proximity to pin contacts arranged within receptacle connector 120. Accordingly, electromagnetic radiation (or other types of radiation, such as optical radiation) from components such as those mounted on PCB 172 may interfere with currents (or information-carrying light or sound waves), and thus data, being communicated via the contacts arranged within receptacle connector 120. Further, electromagnetic radiation (or other types of radiation) from currents (or other types of communication mediums, such as light waves or sound waves) being communicated via such contacts may also generate electromagnetic radiation (or other types of radiation) that may interfere with the operation of other components of device 100, such as those mounted on PCB 172.

It may also be apparent that while the components of device 100 are integrated into a single unit, receptacle connector 120 provides a relatively large opening in which moisture may infiltrate device 100. Moisture that infiltrates device 100 via receptacle connector 120 may traverse along the contacts of receptacle connector 120 to contact internal components of the device 100 such as components mounted on PCB 172. Such moisture infiltration may consequently render the device 100 inoperable, and be difficult to detect after the moisture has dried.

Electronic device 100 in certain embodiments includes various components such as a storage element 134, processing circuitry 136, and one or more input/output devices 138. However, it will be appreciated by those of ordinary skill in the art that the electronic device could operate equally well by having fewer or a greater number of components than are illustrated in FIGS. 1A to 1C. Thus, the depiction of electronic device 100 in FIGS. 1A to 1C should be taken as being illustrative in nature, and not limiting to the scope of the disclosure.

Figure 2A:
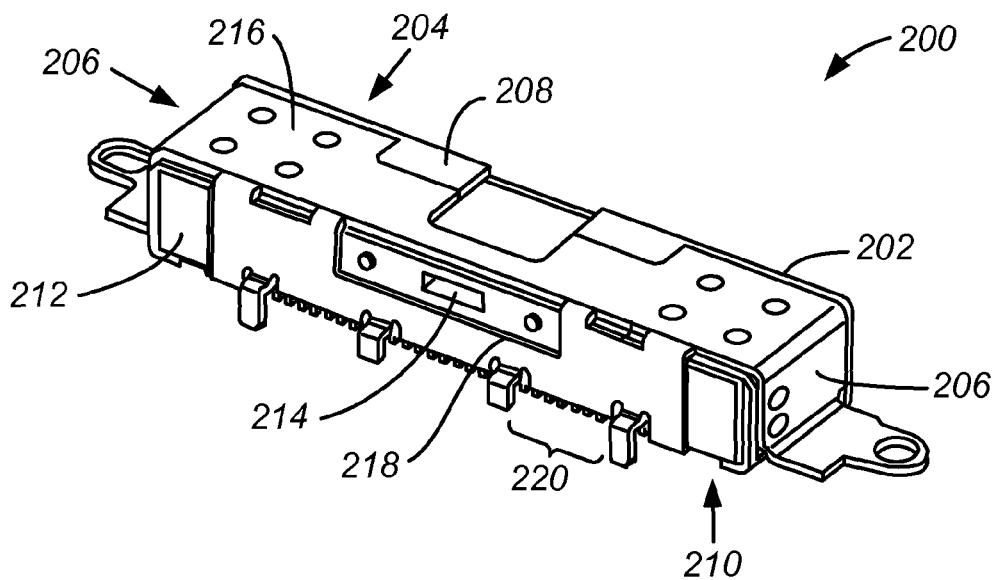
FIG. 2A is a perspective view of a connector according to an embodiment of the present invention.

FIG. 2A is a profile view of a connector 200 according to an embodiment. Connector 200 may be any suitable type of connector for mechanically engaging another device or element and for communicating signals between the devices/elements. In one embodiment, signals may be communicated electrically. For example, connector 200 may be operable to receive electrical inputs and/or provide electrical outputs. In other embodiments, signals may be communicated optically. For example, connector 200 may be operable to receive optical inputs and/or provide optical outputs. In some embodiments, connector 200 is one or more of a video connector (e.g., BNC, DisplayPort™, DVI-D, HDMI, HD15, etc.), an audio connector (e.g., ¼ inch, 3.5 mm, banana plug, etc.), a USB connector (A-type, B-type, micro, etc.), a firewire connector (e.g., 4 pin, 6 pin, 9 pin, etc.), etc. In yet other embodiments, signals may be communicated using a combination of signal types. For example, connector 200 may be operable to communicate both electrical and optical signals.

In the embodiment discussed with reference to FIG. 2A, connector 200 is a receptacle connector operable to receive a 30 pin connector such as that described in U.S. Pat. No. 6,776,660, which is incorporated herein by reference in its entirety. However, embodiments of the invention are not limited to receptacle connectors nor connectors that are operable to receive a 30 pin connector. Rather, embodiments of the invention include plug connectors as well as other types of electrical connectors operable to communicate information over a variety of types of signals. In some embodiments, connector 200 is a dual-orientation connector such as any of those described in U.S. Provisional Patent Application No. 61/556,692, filed Nov. 7, 2011, U.S. Provisional Patent Application No. 61/565,372, filed Nov. 30, 2011, U.S. patent application Ser. No. 61/694,423, titled "DUAL ORIENTATION ELECTRONIC CONNECTOR", filed Aug. 29, 2012 and U.S. patent application Ser. No. 14/357,200, titled "CONNECTORS FOR ELECTRONIC DEVICES", filed Sep. 7, 2012 all of which are incorporated herein by reference in their entirety for all purposes. Connector 200 may also, in some embodiments, be an RS232 serial connector, a USB connector, an S-video connector, a VGA connector, an SDI connector, etc.

Connector 200 as shown in FIG. 2A includes a housing 202 defining a cavity for receiving a male connector. Connector 200 (and housing 202) may include a front surface 204 for receiving a male connector, side surfaces 206 arranged perpendicular to front surface 204 and disposed opposite one another, top surface 208 arranged perpendicular to front surface 204 and side surfaces 206, bottom surface 210 arranged opposite top surface 208, and rear surface 212 arranged opposite front surface 204. Housing 202 may include a protruding portion or tongue (not shown) that extends into the cavity of the housing from rear surface 212.

Housing 202 may be made of any suitable material, including conductive and/or non-conductive materials, and may be made from a single component or multiple components. In one embodiment, housing 202 is made from plastic or other solid material having low electrical conductivity.

Housing 202 may include a window 214 for viewing a moisture indicator (not shown). In one embodiment, window 214 is an aperture extending from the cavity through the rear surface 212 of the housing. In other embodiments, window 214 is an aperture extending from the cavity through one or more other surfaces of the housing, such as bottom surface 210. Window 214 may have any suitable shape, including square, rectangular, circular, oval, etc., and may be of any suitable size to view the moisture indicator, such as 1 mm$^2$, 2 mm$^2$, 3 mm$^2$, the range of 1 mm$^2$ to 3 mm$^2$, less than 1 mm$^2$, or greater than 3 mm$^2$.

Connector 200 may also include a shielding element 216 for reducing the susceptibility of a connector (not shown) engaged with connector 200 to interference from radiation emitted by other components such as electrical components integrated on PCB 172 and/or reducing the amount of radiation emitted by connector 200 as a result of an electrical connection with an engaged male connector.

Shielding element 216 may be made of any suitable material for reducing interference from radiation emitted by other components. For example, shielding element 216 may be a sheet metal, a metal screen, a large crystalline grain structure foil or sheet metal, and/or a nanocrystalline grain structure ferromagnetic metal, and may be made of one or more suitable conductive and/or magnetic materials such as metals (e.g., copper, nickel, etc.), metal alloys (e.g., a nickel-iron alloy, a nickel-iron-copper-molybdenum alloy, etc.), etc. In some embodiments, shielding element 216 may also or alternatively be opaque or have light-absorbing properties.

Shielding element 216 may be shaped to substantially surround housing 202. For example, shielding element 216 may cover substantial portions of side surfaces 206, top surface 208, bottom surface 210, and rear surface 212. By surrounding housing 202, a resistance to interference from other components and the amount of radiation emitted from connector 200 may be significantly reduced.

Shielding element 216 may include various cutouts for exposing various portions of housing 202. For example, shielding element 216 may include cutout 218 aligned with window 214 of housing 202. Cutout 218 is an aperture extending through the body of shielding element 216, and may extend through any suitable surface of shielding element 216 such as a top, side, rear, or bottom surface. Cutout 218 may be of any suitable size and shape, similar to window 214, and may be arranged on a surface of housing 202 similar to window 214. For example, cutout 218 may be shaped and sized so that at least a portion of window 214 is not covered by shielding element 216 or is otherwise exposed. In this fashion, a moisture indicator (not shown) may be arranged on a side of shielding element 216 opposite the cavity and proximate cutout 218 and window 214 so that the moisture indicator may be viewed from the cavity through housing 202 and through shielding element 216.

Connector 200 may also include a plurality of contacts for engaging receptacle contacts of a mating connector. In one embodiment, the contacts may be in the shape of a pin, although other shapes as known in the art may be used. The contacts may be operable to communicate information therethrough using, for example, electricity, light, sound waves, or other communication medium. The contacts may be made of any suitable material for communicating different types of signal, such as a metal (e.g., copper, bronze, gold, etc.), metal alloy, glass, ceramic, etc. The contacts may each include a portion (not shown) supported by the protruding portion or tongue (not shown) of the housing 202, and may also include an exposed portion 220 extending from the rear surface 212 of the housing 202. A bottom surface of the exposed portion 220 of each contact may be communicatively coupled to (e.g., bonded to, contacted with, etc.) other electrical (or optical, etc.) components of the portable electronic device 100 such as PCB 172. The exposed portion 220 of the contacts may be particularly susceptible to outside interference such as EMI and generate relatively large amounts of radiation such as electromagnetic radiation.

Shielding element 216 may extend along the rear surface 212 of the housing 202 to different lengths from the top surface 208. In some portions, shielding element 216 may extend to but not over or past the exposed portion 220 of the contacts. In other portions, shielding element 216 may extend over and/or past the exposed portion 220 of the contacts. By extending over/past the exposed portion 220 of at least some of the contacts, the amount of radiation communicated by connector 200 is reduced, and the amount of interference induced onto the contacts of connector 200 is also reduced.

Figure 2B:
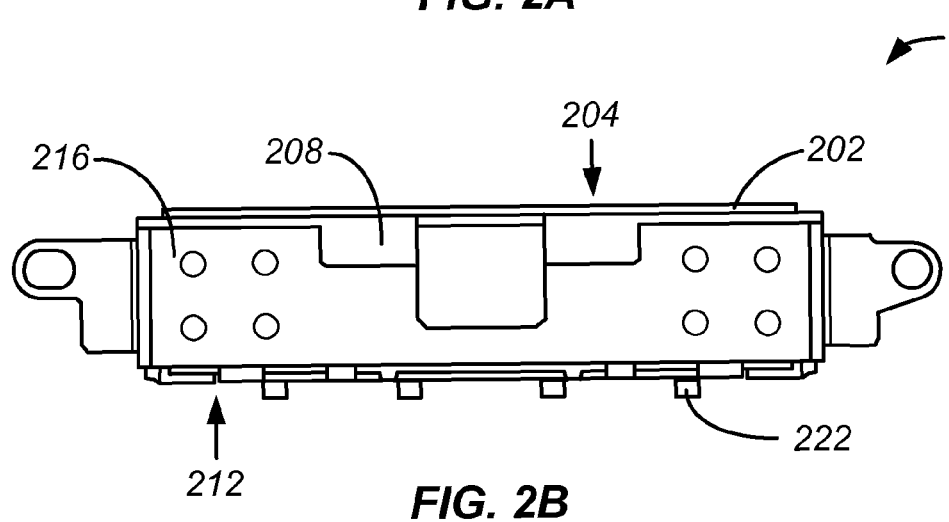
FIG. 2B is a top view of the connector shown in FIG. 2A.

FIG. 2B is a top view of the connector 200 shown in FIG. 2A. From the top view, it is apparent that that shielding element 216 extends flush along the rear surface 212 of housing 202. However, for portions of the shielding element 216 that extend over or past protruding portions of the contacts of the connector 200, the shielding element 216 may include a portion 222 that extends away from rear surface 212. Portion 222 of shielding element 216 may allow the shielding element 216 to extend over or past protruding portions of the contacts where the protruding portions of the contacts extend from the rear surface 212 of the housing 202.

Figure 2C:
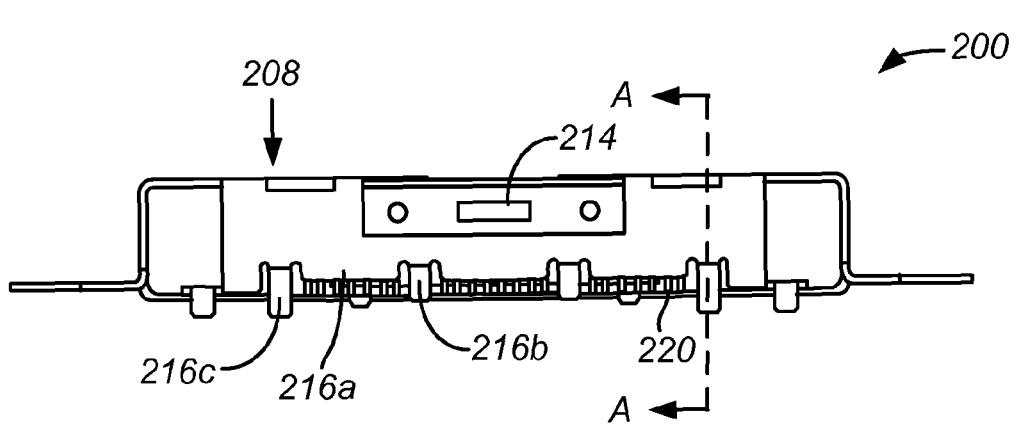
FIG. 2C is a rear view of the connector shown in FIG. 2A.

FIG. 2C is a rear view of the connector 200 shown in FIG. 2A. From the rear view, it is apparent that portions of shielding element 216 such as first portion 216a may extend from the top surface 208 of housing 202 and terminate before reaching the exposed portion 220 of some of the contacts, other portions of the shielding element such as second portion 216b may extend from the top surface 208 of housing 202 and terminate over the exposed portion 220 of some of the contacts, and yet other portions of the shielding element such as third portion 216c may extend from the top surface 208 of housing 202 past the exposed portion 220 of some of the contacts. Accordingly, from the rear view of the connector 200, some of the contacts may be visible or at least partially visible while others may not be visible at all.

Connector 200 in certain embodiments includes various components such as a housing 202, contacts 220, and a shielding element 216. However, it will be appreciated by those of ordinary skill in the art that the connector could operate equally well by having fewer or a greater number of components than are illustrated in FIGS. 2A to 2C. Thus, the depiction of electrical connector 200 in FIGS. 2A to 2C should be taken as being illustrative in nature, and not limiting to the scope of the disclosure.

Figure 3A:
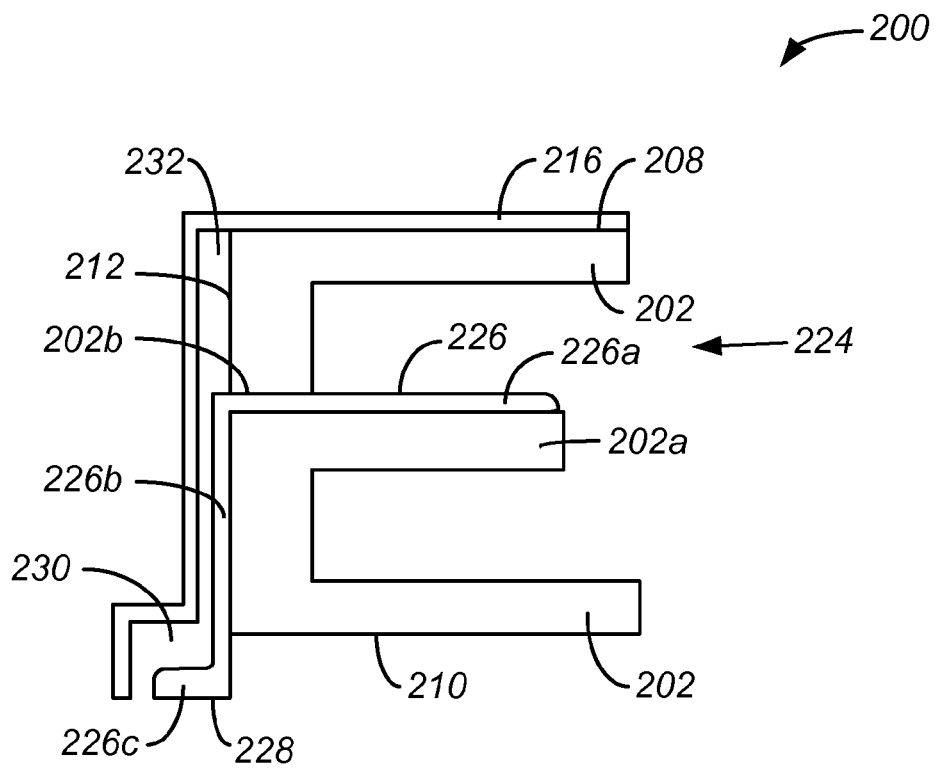
FIG. 3A shows a cross section along line A of the connector shown in FIG. 2C according to a first embodiment.

FIG. 3A shows a cross section along line A of the connector 200 shown in FIG. 2C according to a first embodiment. Connector 200 may have any suitable cross-section of a connector. The shape of the cross-section may be suitably shaped and sized to receive a mating connector. In some embodiments, a housing of the connector will, at least in part, define a cavity for receiving the mating connector. Further, the connector 200 may include at least one contact that extends into the cavity through the housing such that a portion of the contact located inside of the cavity may establish an electrical, optical, or other type of connection with the mating connector and a portion of the contact located outside of the cavity may establish an electrical, optical, or other type of connection with other portions of electronic device 100.

Housing 202 according to one embodiment defines a cavity 224 for receiving a mating connector (in this case, a male connector), and includes a contact support member or tongue 202a that protrudes into a portion of the cavity 224. Tongue 202a protrudes from the rear surface 212 of the housing 202 any suitable amount and may also define cavity 224. Cavity 224 may be shaped to receive protruding components of the mating connector. Housing 202 may also include an aperture 202b extending from the rear surface 212 of the housing to the cavity 224 and shaped to receive a contact. In some embodiments, aperture 202b may be shaped to receive more than one contact 226, and in some embodiments, multiple apertures 202b may be provided (e.g., one for each contact 226).

Connector 200 may further include one or more contacts 226 as previously discussed. Contacts 226 may be operable to electrically, optically, or otherwise contact corresponding contacts of a mating connector (not shown) when the mating connector is engaged with connector 200. Contacts 226 may include a first portion 226a extending into cavity 224 and being supported by contact support member 202a. First portion 226a may contact corresponding contacts of the mating connector (not shown) when the mating connector is engaged with the connector 200 and, in some embodiments, may extend through aperture 202b of housing 202. In some embodiments, first portion 226a may contact tongue 202a of housing 202 as a result of a friction fit with housing 202, and in some cases first portion 226a may be bonded to contact support member 202a using any suitable bonding technique.

Contacts 226 may also include a second portion 226b that extends from aperture 202b toward the bottom surface 210 of housing 202. Although in this embodiment second portion 226b is shown to extend past bottom surface 210, in other embodiments, second portion 226b extends to bottom surface 210 or terminates before reaching bottom surface 210. Further, in this embodiment, second portion 226b extends along the rear surface 212 of housing 202. In some embodiments, second portion 226b may contact rear surface 212 of housing 202 as a result of a friction fit with housing 202, and in some cases second portion 226b may be bonded to rear surface 212 using any suitable bonding technique.

Contacts 226 may further include a third portion 226c (e.g., a leg, tab, or base of the contact) extending from the second portion 226b in a direction away from cavity 224. For example, third portion 226 may extend in a direction perpendicular to rear surface 212. Third portion 226 may extend any suitable amount from rear surface 212. For example, third portion 226 may extend from rear surface 212 a distance of 0.1 mm, 0.2 mm, 0.3 mm, a range between 0.1 mm and 0.3 mm, less than 0.1 mm or greater than 0.3 mm. Third portion 226 may have any suitable shape. While FIG. 3A shows third portion 226 having a substantially rectangular cross section, third portion 226 may be square, oval, circular, etc. In some embodiments, bottom surface 228 of contacts 226 may be mechanically bonded (e.g., soldered) to other components of an electronic device, such as to the previously discussed PCB 172 of portable electronic device 100 (FIG. 1C). The bonding (e.g, soldering) may establish an electrical connection between the contact 226 and a bonding pad of PCB 172. In other embodiments, bottom surface 228 of contacts 226 may be optically coupled (e.g., by fusing) to other components of an electronic device. The coupling (e.g., fusing) may establish an optical connection between the contact 226 and a optical coupler of PCB 172. One of ordinary skill in the art would recognize other types of coupling based on the communication medium used, and all such other types are within the scope of the inventions discussed herein.

Shielding element 216, as previously discussed, is formed over top surface 208, rear surface 212, and some portions of contacts 226. Shielding element 216 may be bonded to top surface 208 using any suitable bonding technique, such as by laser welding. In this embodiment, shielding element 216 extends over both second portion 226b and third portion 226c of at least one contact 226. By extending over both second portion 226b and third portion 226c of contact 226, radiation emitted from and/or induced onto contact 226 may advantageously be reduced.

Figure 3B:
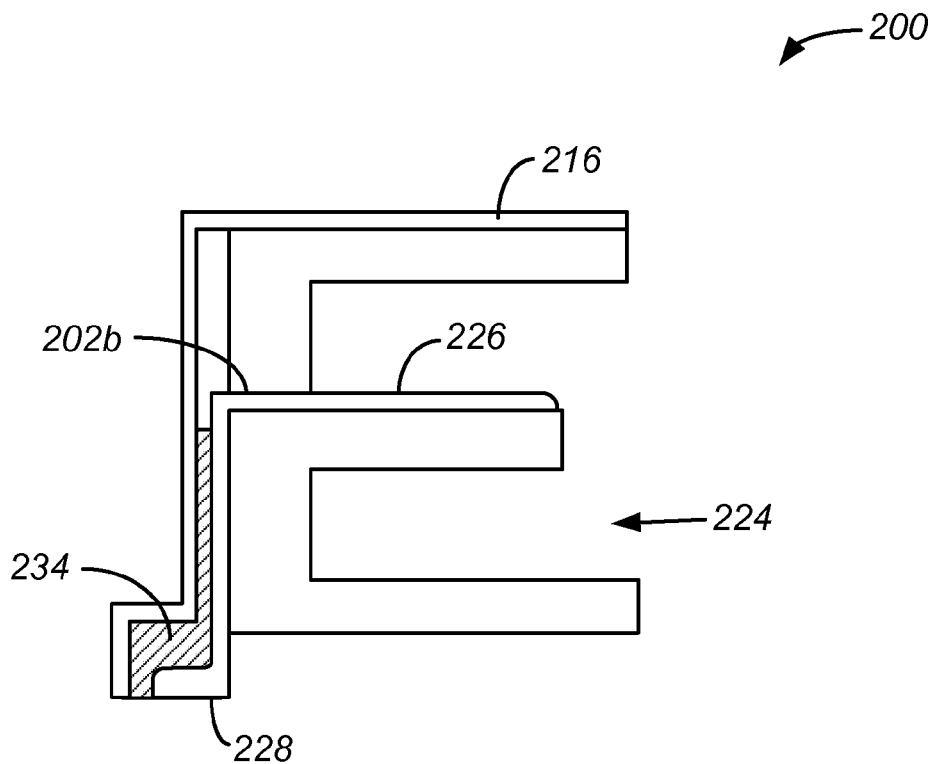
FIG. 3B shows a cross section along line A of the connector shown in FIG. 2C according to a second embodiment.

FIG. 3B shows a cross section 300 along line A of the connector 200 shown in FIG. 2C according to a second embodiment. The embodiment of the connector 200 shown in FIG. 3B is similar to that discussed with reference to FIG. 3A, except that the embodiment shown in FIG. 3B further includes a moistures sealant 234.

With reference to FIG. 3A, as shielding element 216 is spaced apart from contact 226, a gap 230 is formed between shielding element 216 and the contact 226. In this embodiment, connector 200 further includes a moisture sealant 234 disposed within gap 230. Moisture sealant 234 may be any suitable material that prevents ingress of moisture from cavity 224 into electronic device 100. For example, moisture sealant 234 may be a polymer, a plastic, polyethylene terephthalate, etc. In some embodiments, moisture sealant 234 may also be operable to bond to the surfaces of which it contacts. For example, moisture sealant 234 may be an epoxy. Moisture sealant 234 may establish a water-resistant bond to contact 226 and shielding element 216. In one embodiment, moisture sealant 234 may be also be made of an electrically insulative material. By being made of an electrically insulative material, moisture sealant 234 may operate to electrically insulate contact 226 from shielding element 216.

Moisture sealant 234 may extend between any suitable portions of shielding element 216 and contact 226. For example, as shown in FIG. 3B, moisture sealant 234 may extend from bottom surface 228 of contact 226 to a location below aperture 202b. For another example (not shown), moisture sealant 234 may extend from bottom surface 228 to a location at or past aperture 202b. For yet another example (not shown), moisture sealant 234 may extend from a location above bottom surface 228 to a location below aperture 202b. In some embodiments, as previously discussed, shielding element 216 may extend along rear surface 212 to different lengths from top surface 208. Moisture sealant 234 may, in some cases, also extend along rear surface 212 to different lengths corresponding to the different lengths of shielding element 216. By extending over surfaces of contact 226, moisture sealant 234 may advantageously provide protection for the contact 226 against corrosion.

Figure 3C:
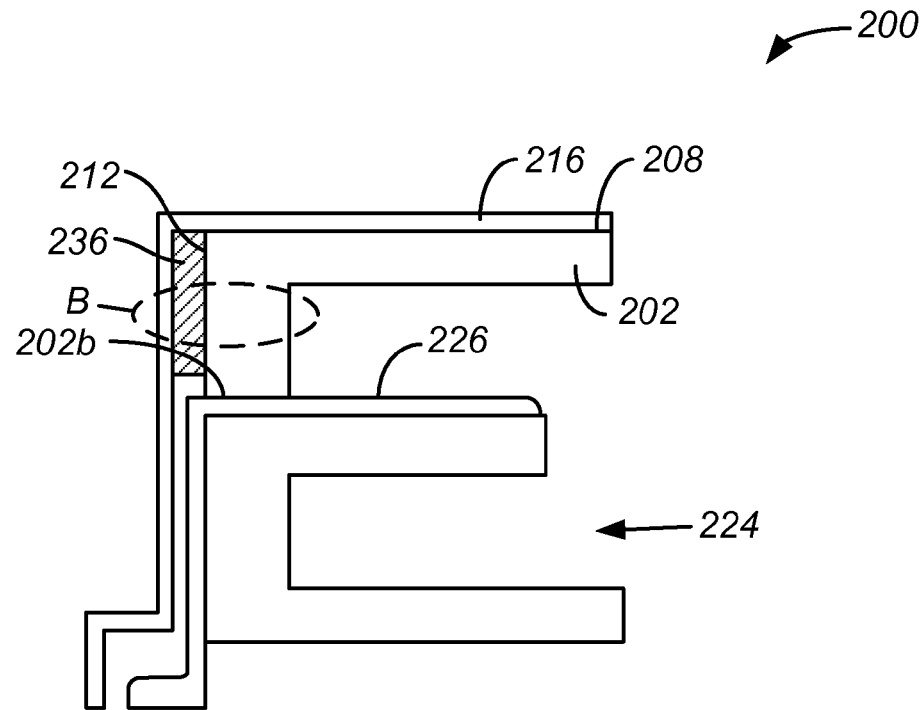
FIG. 3C shows a cross section along line A of the connector shown in FIG. 2C according to a third embodiment.

FIG. 3C shows a cross section 300 along line A of the connector 200 shown in FIG. 2C according to a second embodiment. The embodiment of the connector 200 shown in FIG. 3C is similar to that discussed with reference to FIG. 3A, except that the embodiment shown in FIG. 3C further includes a cap 236.

With reference to FIG. 3A, as shielding element 216 is spaced from rear surface 212 of housing 202, a gap 232 is formed between rear surface 212 of housing 202 and shielding element 216. In this embodiment, connector 200 further includes a cap 236 disposed within gap 232. Cap 236 may be any suitable material that prevents ingress of moisture from cavity 224 into electronic device 100. For example, cap 236 may be a polymer, a plastic, polyethylene terephthalate, etc. In some embodiments, cap 236 may be bonded to rear surface 212 of housing 202 and to shielding element 216. In one embodiment, cap 236 may be also be made of an electrically insulative material. By being made of an electrically insulative material, moisture cap 236 may operate to electrically insulate contact 226 from shielding element 216.

Cap 236 may extend between any suitable portions of shielding element 216 and rear surface 212 of housing 202. For example, as shown in FIG. 3C, cap 236 may extend from top surface 208 of housing 202 to a location above aperture 202b. For another example (not shown), cap 236 may extend from top surface 208 to a location at or past aperture 202b. For yet another example (not shown), cap 236 may extend from a location below top surface 208. In some cases, cap 236 may also be arranged between other surfaces of housing 202 and shielding element 216. For example, cap 236 may be arranged between top surface 208 of housing 202 and shielding element 216. In other cases, instead of forming cap 236, portions of housing 202 may take the form of cap 236. For example, housing 202 at locations above aperture 202b may extend from cavity 224 all the way to shielding element 216 such that rear surface 212 of housing 202 contacts shielding element 216.

Figure 3D:
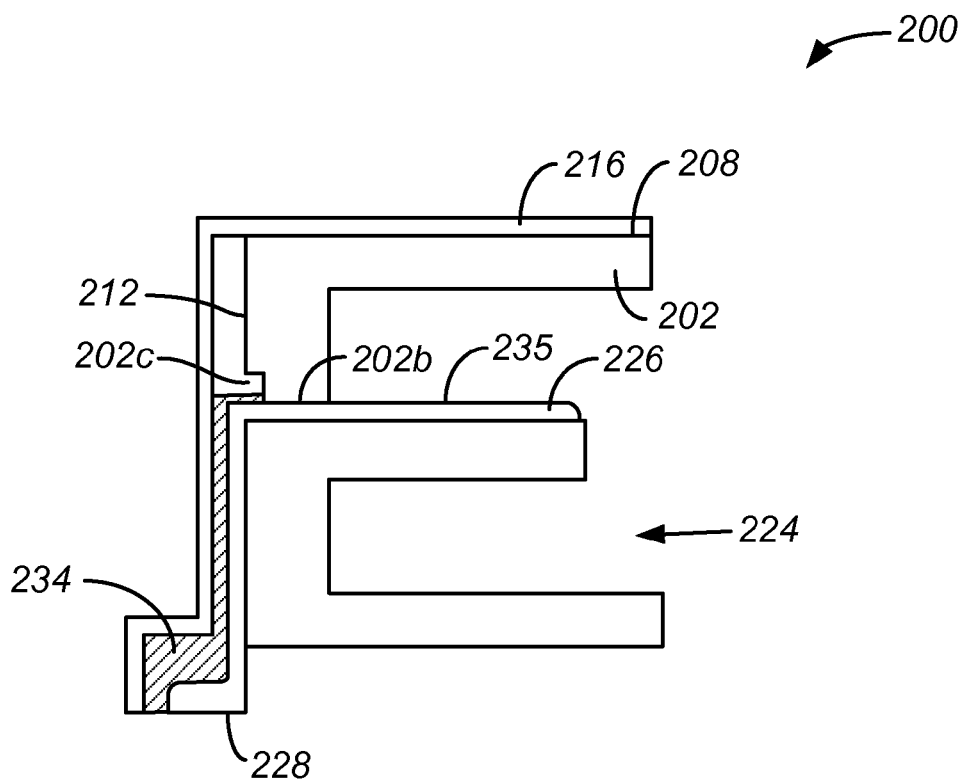
FIG. 3D shows a cross section along line A of the connector shown in FIG. 2C according to a fourth embodiment.

FIG. 3D shows a cross section 300 along line A of the connector 200 shown in FIG. 2C according to a fourth embodiment. The embodiment of the connector 200 shown in FIG. 3D is similar to that discussed with reference to FIG. 3B, except that the embodiment shown in FIG. 3D further includes a channel 202c.

With reference to FIG. 3B, in one embodiment, moisture sealant 234 may be formed by spraying a liquid sealant over at least a portion of connector 200 after providing connector 200 with housing 202, contacts 226, and shielding element 216. Once liquid sealant has been sprayed, the liquid may solidify and consequently bond to the surfaces it is contact with. Moisture sealant 234, as a liquid, may wick up and into gap 230 (FIG. 3A) from bottom surface 228. According to one embodiment, housing 202 includes a channel 202c formed therein, where channel 202c is operable to receive at least some portion of moisture sealant 234. Channel 202c may advantageously prevent or reduce an amount of liquid moisture sealant 234 from wicking not only into gap 230 but also over and onto contact surface 235 of contact 226. Where contact 226 operates to communicate signals electrically, wicking of liquid moisture sealant 234 onto contact surface 235 of contact 226 may be undesirable since liquid moisture sealant 234 may reduce the electrical conductivity between contact 226 and a corresponding contact of a mating connector.

In one embodiment, channel 202c is a cutout from rear surface 212 of housing 202. Channel 202c may be cutout from any suitable location along rear surface 212. For example, channel 202c may be cutout from a location immediately adjacent to aperture 202b. For another example, channel 202c may be cutout from a location between aperture 202b and top surface 208 of housing 202. As later discussed with reference to FIGS. 4A to 4C, channel 202c may extend along a direction in which contacts 226 are provided, and housing 202 may include one or more channels 202c. Further, channel 202c may have any suitable shape. For example, as shown in FIG. 3D, channel 202c may have a square cross-section. In other embodiments, however, channel 202c may have a rectangular, circular, oval, or other suitably shaped cross-section.

Figure 3E:
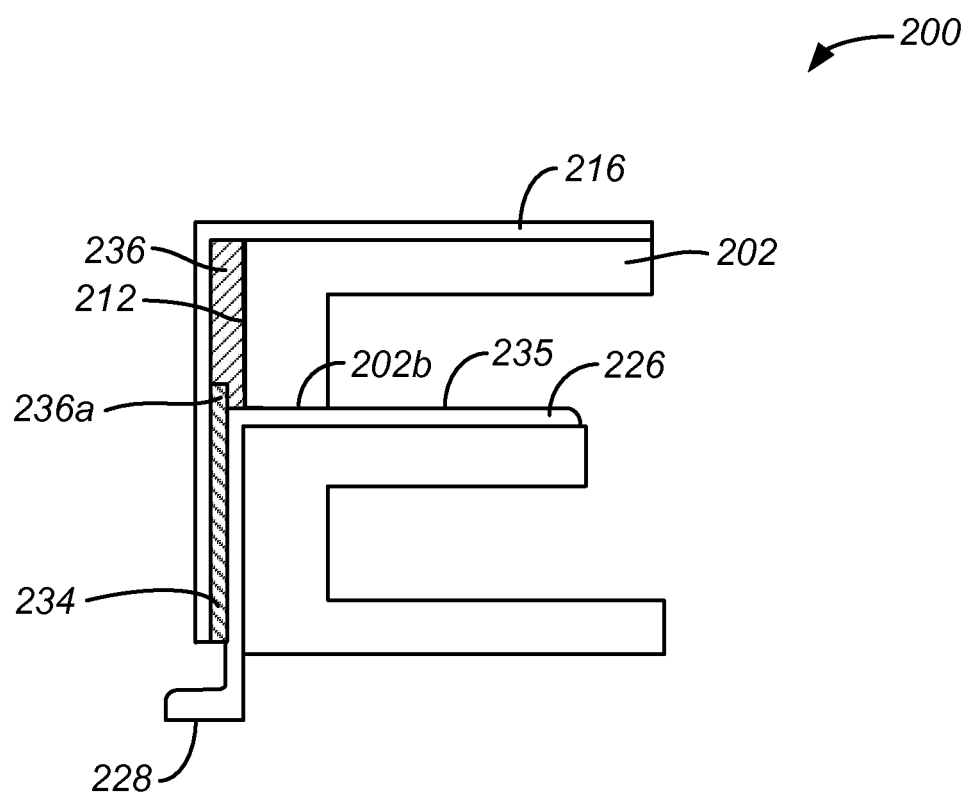
FIG. 3E shows a cross section along line A of the connector shown in FIG. 2C according to a fifth embodiment.

FIG. 3E shows a cross section 300 along line A of the connector 200 shown in FIG. 2C according to a fifth embodiment. The embodiment of the connector 200 shown in FIG. 3E is similar to that discussed with reference to FIG. 3D, except that the embodiment shown in FIG. 3E further includes a channel 236a and cap 236.

Instead of having channel 202c arranged within housing 202, connector 200 includes a channel 236a formed within cap 236, where channel 236a is operable to receive at least some portion of moisture sealant 234. Channel 236a, like channel 202c, may advantageously prevent or reduce an amount of liquid moisture sealant 234 from wicking not only into gap 230 (FIG. 3A) but also over and onto contact surface 235 of contact 226.

Channel 236a may be cutout from any suitable location along a surface of cap 236 facing gap 230. For example, channel 236a may be cutout from a surface of cap 236 facing contact 226. Channel 236a may also be cutout from a surface of cap 236 in contact with shielding element 216 and/or a surface of cap 236 in contact with rear surface 212 of housing 202. As later discussed with reference to FIGS. 4A to 4C, channel 236a may extend along a direction in which contacts 226 are provided, and housing 202 may include one or more channels 236a. Further, channel 236a may have any suitable shape. For example, as shown in FIG. 3E, channel 236a may have a square cross-section. In other embodiments, however, channel 236a may have a rectangular, circular, oval, or other suitably shaped cross-section.

FIG. 3E also shows an embodiment where shielding element 216 and moisture sealant 234 do not extend all the way to bottom surface 228 of contact 226. Rather, both shielding element 216 and moisture sealant 234 extend to a location between aperture 202b and bottom surface 228.

It should be appreciated that the specific features illustrated in FIGS. 3A to 3E provide particular examples of improved connectors. One of ordinary skill in the art would recognize and appreciate many variations, modifications, and alternatives. For example, the moisture sealant 234 discussed with reference to FIG. 3B may be provided together with cap 236 discussed with reference to FIG. 3C. For another example, the moisture sealant 234 and channel 202c discussed with reference to FIG. 3D may be provided together with cap 236 discussed with reference to FIG. 3C. Other variations, modifications, and alternatives would be apparent to those of ordinary skill in the art.

Figure 4A:
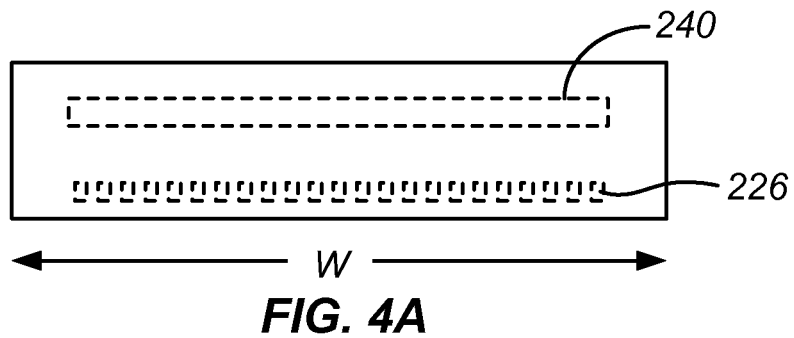
FIG. 4A is a simplified rear view of the connector shown in FIG. 2A showing a channel for receiving moisture sealant according to a first embodiment.

FIG. 4A is a simplified rear view of the connector 200 shown in FIG. 2A showing a channel 240 for receiving moisture sealant according to a first embodiment. As discussed with reference to FIGS. 3D and 3E, a channel may be formed in one or more of housing 202 and cap 236. Channel 240 corresponds to channel 202c discussed with reference to FIG. 3D and/or channel 236a discussed with reference to FIG. 3E.

Channel 240 extends along a width W of connector 200 or, in other words, extends along a direction in which contacts 226 are arranged. Channel 240 may extend any suitable amount along width W. For example, as shown in FIG. 4A, channel 240 my extend along width W approximately the same amount as the arrangement of contacts 226. In this fashion, moisture sealant 234 (FIG. 3B) may be prevented from wicking over a contact surface of any of contacts 226. However, in other embodiments, channel 240 may extend along width W a distance less than (or more than) that which the arrangement of contacts 226 extend. Further, channel 240 may have any suitable shape. For example, as shown in FIG. 4A, channel 240 may have a rectangular cross-section. In other embodiments, however, channel 240 may have a square, circular, oval, or other suitably shaped cross-section.

In one embodiment, channel 240 may be sized to substantially increase an intended moisture sealant 234 deposition volume. The intended deposition volume may be a volume in which it is desired to deposit moisture sealant 234 so as to increase the resilience of the connector to moisture ingress. For example, with reference to FIGS. 2A and 3A, the intended deposition volume may be defined by side surfaces 206, gap 230, and the space between contacts 226 (e.g., second portion 226b of contacts 226) and shielding element 216. Channel 240 may have a volume that is 50%, 100%, or 150% the size of the intended deposition volume, or in the range of 50% to 150%, or less than 50%, or greater than 150%.

Figure 4B:
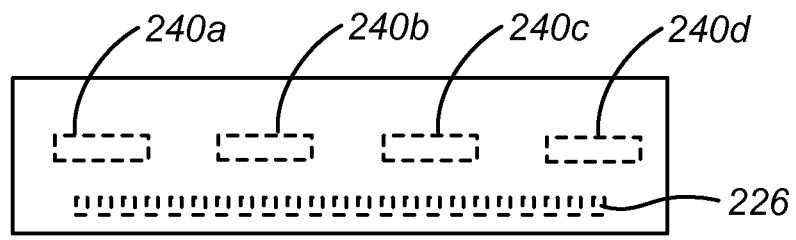
FIG. 4B is a simplified rear view of the connector shown in FIG. 2A showing a channel for receiving moisture sealant according to a second embodiment.

FIG. 4B is a simplified rear view of the connector 200 shown in FIG. 2A showing a channel 240 for receiving moisture sealant according to a second embodiment. The embodiment shown in FIG. 4B is similar to that discussed with reference to FIG. 4A, except that in this case a plurality of channels 240a, 240b, 240c, and 240d are provided. The plurality of channels may be formed in the same component of connector 200 (e.g., housing 202), or may be formed in different components of connector 200 (e.g., housing 202 and cap 236). The channels may be of the same or different size and shape, and may be arranged at the same or different locations and orientations with respect to contacts 226.

Figure 4C:
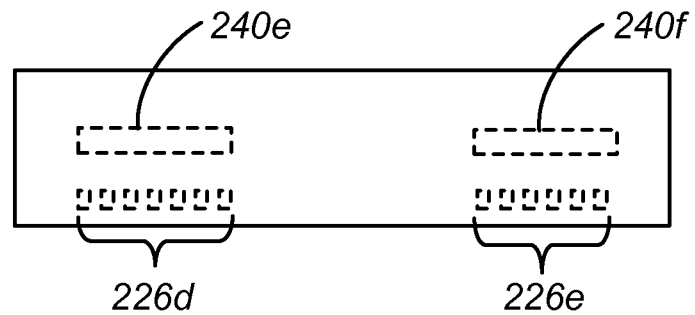
FIG. 4C is a simplified rear view of the connector shown in FIG. 2A showing a channel for receiving moisture sealant according to a third embodiment.

FIG. 4C is a simplified rear view of the connector 200 shown in FIG. 2A showing a channel 240 for receiving moisture sealant according to a third embodiment. The embodiment shown in FIG. 4C is similar to that discussed with reference to FIG. 4B, except that in this case a plurality of channels 240e, 240f are provided for multiple groups of contacts 226 including a first group of contacts 226d and a second group of contacts 226e. In one embodiment and as shown in FIG. 4C, each channel is formed over a corresponding group of contacts. In this fashion, moisture sealant 234 (FIG. 3B) may be prevented from wicking over a contact surface of any of contacts 226. However, in other embodiments, a channel 240e or channel 240f may extend along a width W greater than that which the corresponding group of contacts extend, or along a width W less than that which the corresponding group of contacts extend.

It should be appreciated that the specific features illustrated in FIGS. 4A to 4C provide particular examples of improved connectors. One of ordinary skill in the art would recognize and appreciate many variations, modifications, and alternatives. For example, the first group of contacts 226d and the second group of contacts 226e discussed with reference to FIG. 4C could be provided with the contacts 226 extending across the width W of connector 200 discussed with reference to FIG. 4A. Other variations, modifications, and alternatives would be apparent to those of ordinary skill in the art.

Figure 5A:
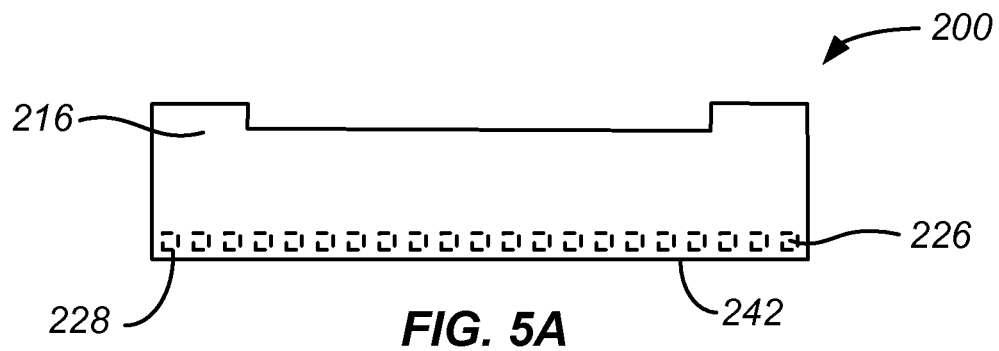
FIG. 5A is a simplified rear view of the connector shown in FIG. 2A showing an arrangement of a shielding element relative to contacts according to a first embodiment.

FIG. 5A is a simplified rear view of the connector 200 shown in FIG. 2A showing an arrangement of shielding element 216 relative to contacts 226 according to a first embodiment. According to this embodiment, a bottom surface 242 of shielding element 216 extends from top surface 208 of housing 202 (FIG. 3A) past bottom surface 228 of all contacts 226. By extending past bottom surface 228 of all contacts 226, an amount of EMI emitted from and induced onto contacts 226 may advantageously be reduced.

Figure 5B:
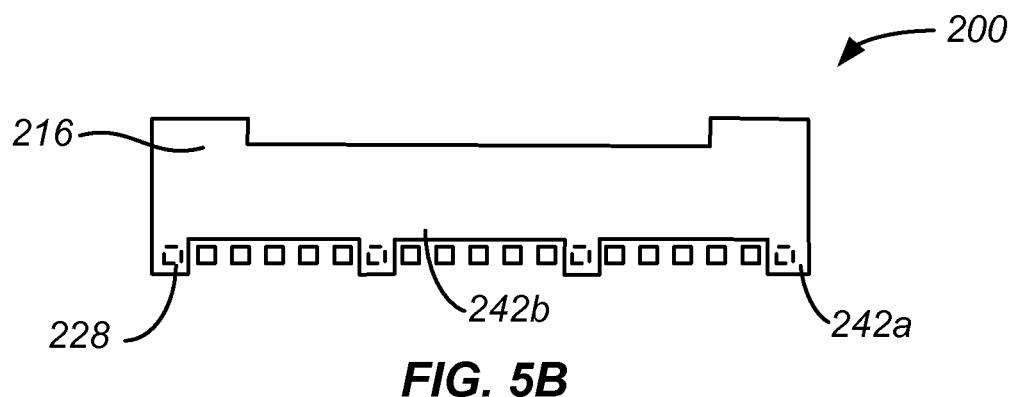
FIG. 5B is a simplified rear view of the connector shown in FIG. 2A showing an arrangement of a shielding element relative to contacts according to a second embodiment.

FIG. 5B is a simplified rear view of the connector 200 shown in FIG. 2A showing an arrangement of shielding element 216 relative to contacts 226 according to a second embodiment. The embodiment shown in FIG. 5B is similar to that discussed with reference to FIG. 5A, except in this case bottom surface 242 includes portions 242a that each extend past bottom surface 228 of a corresponding contact 226, and includes portions 242b that terminate before reaching bottom surface 228. For example, the surface of contacts 226 shown in FIG. 5B may correspond to a rear surface (e.g., a surface facing away from cavity 224) of the third portion 226c of contact 226 discussed with reference to FIG. 3A. In this case, the bottom surface of portion 242b of shielding element 216 may terminate before reaching the third portion 226c of contact 226, whereas a bottom surface of portion 242a extends past third portion 226c. Further in this embodiment, a distance between portions 242a is the same, and the number of contacts 226 arranged between portions 242a is also the same.

In some embodiments, as previously discussed with reference to FIG. 3D, moisture sealant 234 may be formed by spraying a liquid sealant over at least a portion of connector 200, where moisture sealant 234 may wick up and into gap 230 (FIG. 3A). Portions that terminate before reaching the bottom surface of a contact (e.g., portions 242b) may advantageously increase a wicking of moisture sealant 234 into a gap 230 for that contact, whereas portions that extend past the bottom surface of a contact (e.g., portions 242a) may reduce the wicking of moisture sealant 234 into the gap 230 for that contact. Thus, in some embodiments, portions 242a may be sized and/or spaced with respect to one another to allow the sprayed liquid sealant to uniformly coat contacts 226 along the width of the connector. For example, as shown in FIG. 5B, portions 242a may be uniformly spaced with respect to one another.

Figure 5C:
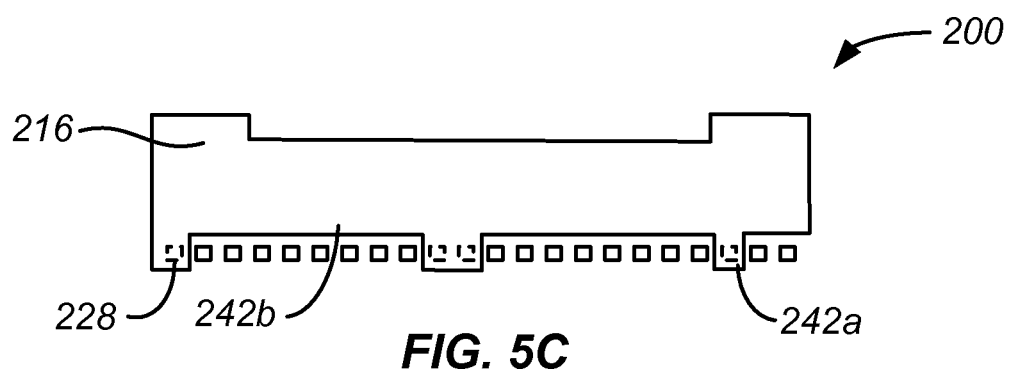
FIG. 5C is a simplified rear view of the connector shown in FIG. 2A showing an arrangement of a shielding element relative to contacts according to a third embodiment.

FIG. 5C is a simplified rear view of the connector 200 shown in FIG. 2A showing an arrangement of shielding element 216 relative to contacts 226 according to a third embodiment. The embodiment shown in FIG. 5C is similar to that discussed with reference to FIG. 5B, except in this case the distance between portions 242a is not equal, and the number of contacts 226 arranged between portions 242a is also not equal.

Figure 5D:
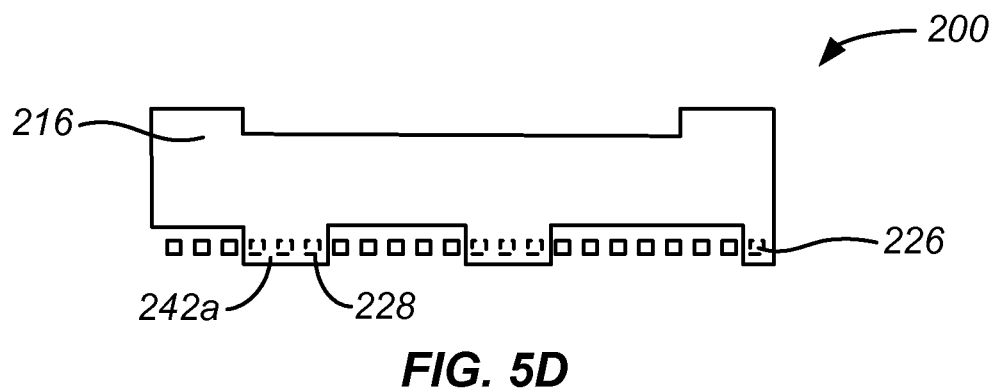
FIG. 5D is a simplified rear view of the connector shown in FIG. 2A showing an arrangement of a shielding element relative to contacts according to a fourth embodiment.

FIG. 5D is a simplified rear view of the connector 200 shown in FIG. 2A showing an arrangement of shielding element 216 relative to contacts 226 according to a fourth embodiment. The embodiment shown in FIG. 5D is similar to that discussed with reference to FIG. 5C, except in this case each of at least some of portions 242a extend past the bottom surface 228 of more than one contact 226. For example, portion 242a may extend past the bottom surface 228 of three adjacent contacts 226.

Figure 5E:
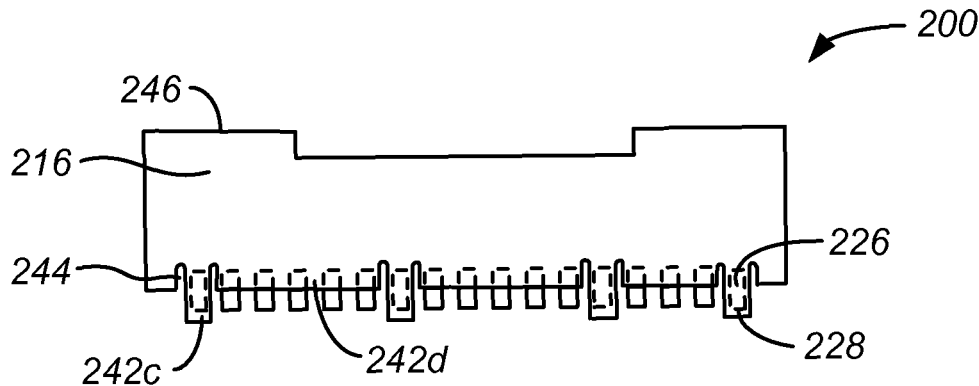
FIG. 5E is a simplified rear view of the connector shown in FIG. 2A showing an arrangement of a shielding element relative to contacts according to a fifth embodiment.

FIG. 5E is a simplified rear view of the connector 200 shown in FIG. 2A showing an arrangement of shielding element 216 relative to contacts 226 according to a fifth embodiment. The embodiment shown in FIG. 5E is similar to that discussed with reference to FIG. 5D, except that in this case, shielding element 216 may include portions that terminate at different locations along contacts 226. For example, the surface of contacts 226 shown in FIG. 5E may correspond to a rear surface (e.g., a surface facing away from cavity 224) of the third portion 226c of contact 226 discussed with reference to FIG. 3A. Portion 242c of shielding element 216 may extend past the bottom surface 228 of contact 226, whereas portion 242d of shielding element 216 may terminate before bottom surface 228 but somewhere along the rear surface of the third portion 226c of contact 226. In this fashion, shielding element 216 may cover the entire rear surfaces of some contacts 226 and only a portion of the rear surfaces of some other contacts 226.

Further, shielding element 216 may include recessed portions 244 that extend in a direction toward a top surface 246 of shielding element 216. Recessed portions 244 may be arranged beside one or more contacts 226 such that they are located between contacts 226. Recessed portions 244 may be disposed proximate to portions 242c, as shown in FIG. 5E, or proximate other portions of shielding element 216, such as portions 242d. Recessed portions 244 may have any suitable shape. For example, as shown in FIG. 5E, recessed portions 244 may be have a curved shape. In other examples, recessed portions 244 may be square, rectangular, or any other suitable shape. By including recessed portions 244, a wicking of moisture sealant 234 (FIG. 3B) into gap 230 (FIG. 3A) may advantageously be increased.

Figure 5F:
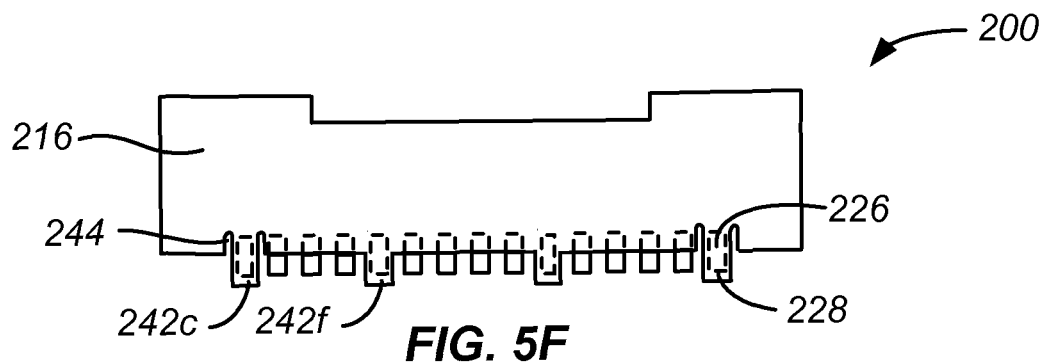
FIG. 5F is a simplified rear view of the connector shown in FIG. 2A showing an arrangement of a shielding element relative to contacts according to a sixth embodiment.

FIG. 5F is a simplified rear view of the connector 200 shown in FIG. 2A showing an arrangement of shielding element 216 relative to contacts 226 according to a sixth embodiment. The embodiment shown in FIG. 5F is similar to that discussed with reference to FIG. 5E, except that in this case, portions 242c of shielding element 216 that extend past bottom surface 228 of contacts 226 are provided adjacent to recessed portions 244, and portions 242f of shielding element 216 that extend past bottom surface 228 of contacts 226 are not provided adjacent to recessed portions 244.

Figure 5G:
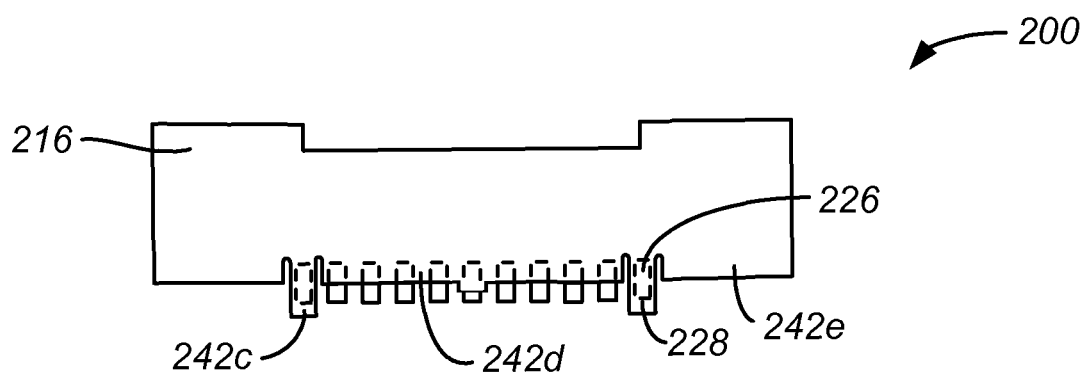
FIG. 5G is a simplified rear view of the connector shown in FIG. 2A showing an arrangement of a shielding element relative to contacts according to a seventh embodiment.

FIG. 5G is a simplified rear view of the connector 200 shown in FIG. 2A showing an arrangement of shielding element 216 relative to contacts 226 according to a seventh embodiment. The embodiment shown in FIG. 5G is similar to that discussed with reference to FIG. 5F, except that in this case, portions 242d terminate along the rear surface of the third portion 226c of contact 226 (FIG. 3A), whereas portions 242c terminate at a location at or after bottom surface 228 of contacts 226.

It should be appreciated that the specific features illustrated in FIGS. 5A to 5G provide particular examples of improved connectors. One of ordinary skill in the art would recognize and appreciate many variations, modifications, and alternatives. For example, recessed portions 244 may be included in portions of shielding element 216 that do not extend entirely over contacts 226. For another example, recessed portions 244 may be provided with portions of shielding element 216 such as portions 242c discussed with reference to FIG. 5E, where instead of extending across only one contact 226, portion 242c may extend across two or more contacts 226. For yet another example, portions of shielding element 216 that extend along or past surfaces of the contacts (e.g., portions 242a and 242c) may be chosen to extend along surfaces of a contact based on the characteristic of the contact. For example, these portions may be chosen to extend along surfaces of a contact known to be operating at a higher electrical voltage and/or data rate than other contacts. Other variations, modifications, and alternatives would be apparent to those of ordinary skill in the art.

Figure 6A:
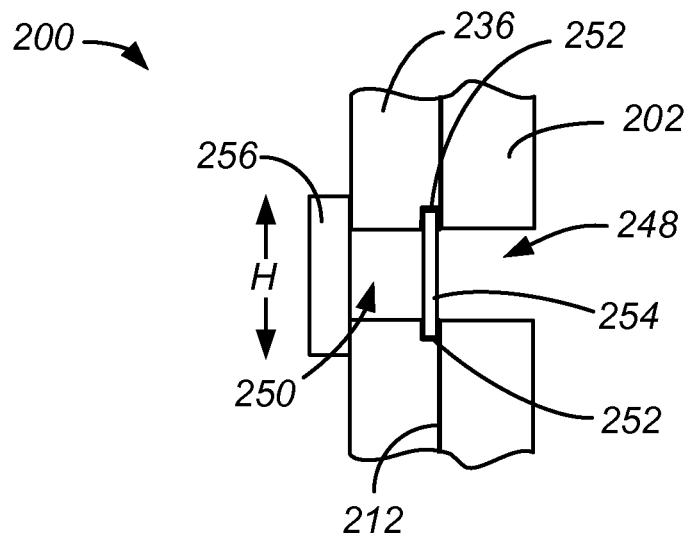
FIG. 6A shows an expanded portion of location B of the electrical connector shown in FIG. 3C and including a moisture infiltration system according to a first embodiment.

FIG. 6A shows an expanded portion of location B of the electrical connector shown in FIG. 3C and including a moisture infiltration system according to a first embodiment. However, according to the embodiment shown in FIG. 6A, there is no shielding element 216 provided.

In the moisture infiltration system shown in FIG. 6A, housing 202 includes an aperture 248 extending from cavity 224 (FIG. 3C) to rear surface 212 of housing 202. Cap 236 also includes an aperture 250 extending through cap 236, where aperture 250 is aligned with aperture 248. Cap 236 is also provided with cutouts 252. In one embodiment, cutouts 252 are cutout from a surface of cap 236 in contact with housing 202. In other embodiments, cutouts 252 may be cutout of any other suitable surface of cap 236.

Connector 200 may include a transparent element 254. Transparent element 254 may be made of any suitable solid material that is transparent, such as plastic, glass, ceramic, etc. Transparent element 254 may have any suitable shape, such as square, rectangular, circular, oval, etc. Transparent element 254 may also have any suitable size. In some embodiments, transparent element 254 is sized to have a height H larger than a height H of apertures 248 and 250. Transparent element 254 may be disposed within cutouts 252 and, by bonding of cap 236 to housing 202, transparent element 254 may be pressed up against portions of housing 202, thereby providing a seal that prevents or reduces moisture ingress from cavity 224.

Connector 200 may also include a moisture indicator 256. Moisture indicator 256 may be provided on a surface of cap 236 opposite that which transparent element 254 is provided. Moisture indicator 256 may be bonded to the surface of cap 236 using any suitable bonding technique, such as by chemical bonding using an epoxy. Further, moisture indicator 256 may be any suitable moisture indicator, including any of those described in U.S. Patent Publication No. 2009/0273480, which is incorporated herein by reference in its entirety. Moisture indicator 256 may be operable to provide an indication of moisture infiltration in response to contact with moisture.

By providing transparent element 254 within the assembly of housing 202 and cap 236 and providing moisture indicator 256 on a side of transparent element 254 opposite cavity 224, a resilience of connector 200 to moisture infiltration may advantageously be increased.

Figure 6B:
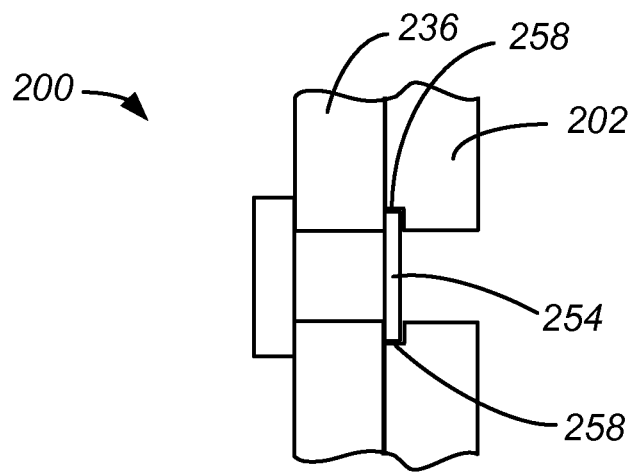
FIG. 6B shows an expanded portion of location B of the electrical connector shown in FIG. 3C and including a moisture infiltration system according to a second embodiment.

FIG. 6B shows an expanded portion of location B of the electrical connector shown in FIG. 3C and including a moisture infiltration system according to a second embodiment. The moisture infiltration system of FIG. 6B is similar to that of FIG. 6A, except that in this case cap 236 does not include cutouts 252 but rather housing 202 includes cutouts 258. Similar to cutouts 252, cutouts 258 may be any of suitable size and shape and provided at any suitable location in housing 202. For example, cutouts 258 may be cutout from a surface of housing 202 in contact with cap 236. Further, transparent element 254 may be disposed within cutouts 258 rather than cutouts 252.

Figure 6C:
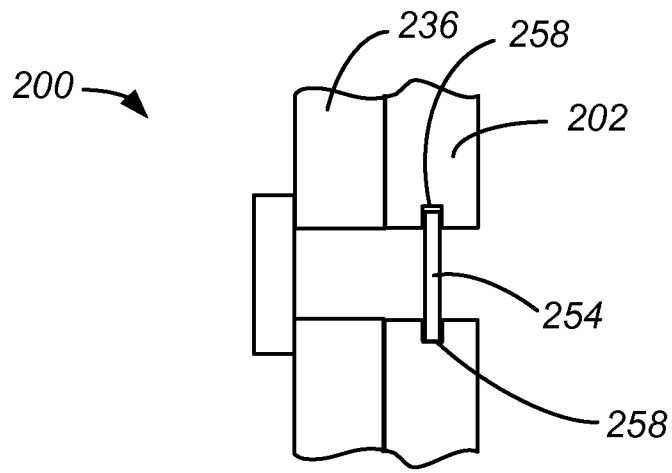
FIG. 6C shows an expanded portion of location B of the electrical connector shown in FIG. 3C and including a moisture infiltration system according to a third embodiment.

FIG. 6C shows an expanded portion of location B of the electrical connector shown in FIG. 3C and including a moisture infiltration system according to a third embodiment. The moisture infiltration system of FIG. 6C is similar to that of FIG. 6B, except that in this case instead of cutout 258 being from a surface of housing 202 in contact with cap 236, cutouts 258 are located within housing 202 at a location between the surface in contact with cap 236 and a surface located opposite the surface in contact with cap 236.

Figure 6D:
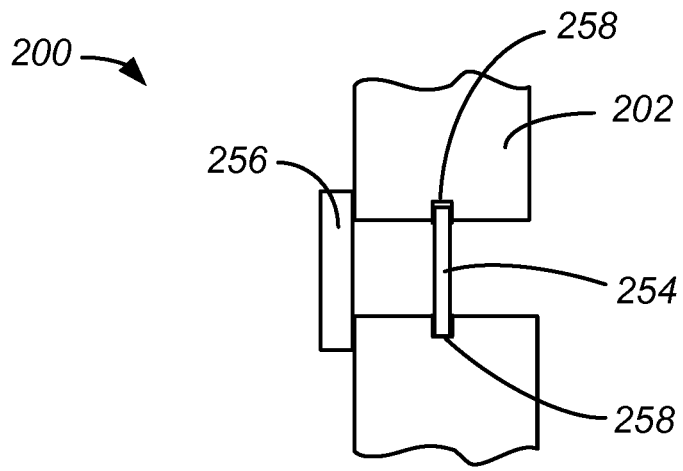
FIG. 6D shows an expanded portion of location B of the electrical connector shown in FIG. 3C and including a moisture infiltration system according to a fourth embodiment.

FIG. 6D shows an expanded portion of location B of the electrical connector shown in FIG. 3C and including a moisture infiltration system according to a fourth embodiment. The moisture infiltration system of FIG. 6D is similar to that of FIG. 6C except that in this embodiment, there is no cap 236. Rather, housing 202 extends from cavity 224 (FIG. 3C) to moisture indicator 256. Similar to the embodiment discussed with reference to FIG. 6C, housing 202 includes cutouts 258 for receiving transparent element 254.

Figure 6E:
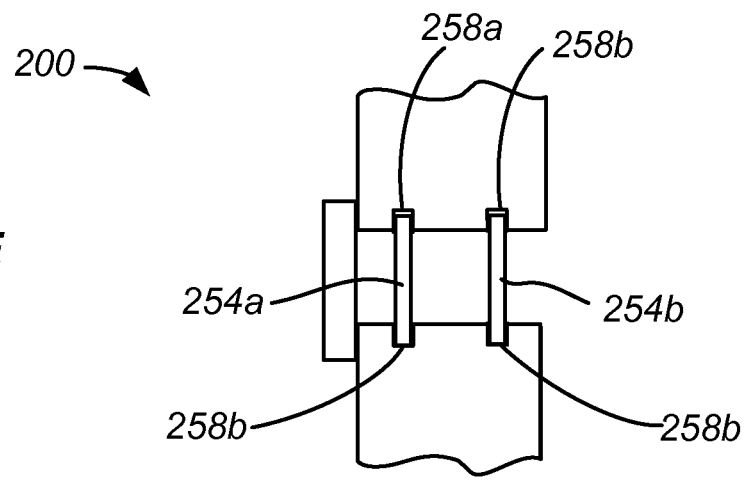
FIG. 6E shows an expanded portion of location B of the electrical connector shown in FIG. 3C and including a moisture infiltration system according to a fifth embodiment.

FIG. 6E shows an expanded portion of location B of the electrical connector shown in FIG. 3C and including a moisture infiltration system according to a fifth embodiment. The moisture infiltration system of FIG. 6E is similar to that of FIG. 6D except that in this embodiment, a plurality of transparent elements 254 are provided. A first transparent element 254a may be provided in a first set of cutouts 258a, and a second transparent element 254b may be provided in a second set of cutouts 258b. In some embodiments, a cap 236 may be provided, and in some cases may also include a transparent element and/or one or more of transparent elements 258a and 258b.

Figure 6F:
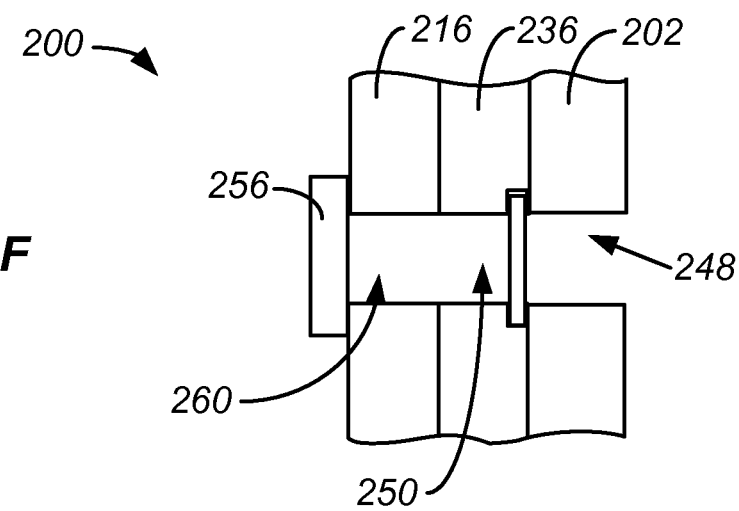
FIG. 6F shows an expanded portion of location B of the electrical connector shown in FIG. 3C and including a moisture infiltration system according to a sixth embodiment.

FIG. 6F shows an expanded portion of location B of the electrical connector shown in FIG. 3C and including a moisture infiltration system according to a sixth embodiment. The moisture infiltration system of FIG. 6F is similar to that of FIG. 6A except that in this embodiment, shielding element 216 is provided between moisture indicator 256 and cap 236. Shielding element 216 may also include an aperture 260 aligned with apertures 248 and 250, and may be formed and shaped similar to apertures 248 and 250. In this embodiment, moisture indicator 256 may be provided on a surface of shielding element 216 opposite that which cap 236 is provided. Moisture indicator 256 may be bonded to the surface of shielding element 216 using any suitable bonding technique, such as by chemical bonding using an epoxy.

It should be appreciated that the specific features illustrated in FIGS. 6A to 6F provide particular examples of improved connectors. One of ordinary skill in the art would recognize and appreciate many variations, modifications, and alternatives. For example, moisture indicator 256 need not be bonded to a rear surface of layer such as cap 236 as discussed with reference to FIG. 6C, but rather moisture indicator 256 may be included in cutouts of cap 236 (or any other suitable layer such as housing 202 or shielding element 216). In such cases, transparent element 254 may also be included and provided at a location closer to cavity 224 than moisture indicator 256. Other variations, modifications, and alternatives would be apparent to those of ordinary skill in the art.

Various embodiments for improved electronic devices and connectors according to the present invention have been described. While these inventions have been described in the context of the above specific embodiments, many modifications and variations are possible. The above description is therefore for illustrative purposes and is not intended to be limiting. Also, references to top or bottom, or front and back of the various structures described above are relative and are used interchangeably depending on the point of reference. Similarly, dimensions and sizes provided throughout the above description are for illustrative purposes only and the inventive concepts described herein can be applied to structures with different dimensions. Accordingly, the scope and breadth of the present invention should not be limited by the specific embodiments described above and should instead be determined by the following claims and their full extend of equivalents.

What is claimed is:

1. A connector comprising:
a housing defining a cavity having an opening for receiving a mating connector, the housing including a contact support member for supporting a plurality of contacts and a rear surface located opposite the opening;
a plurality of contacts supported by the contact support member, the plurality of contacts including protruding portions that protrude outside of the cavity;
a shielding element disposed over the protruding portion of at least some of the contacts and disposed over at least a portion of the rear surface of the housing defining a gap between the shielding element and the housing; and
a cap disposed within the gap, the cap being operable to reduce moisture ingress through the connector and to insulate the plurality of contacts from the shielding element.

2. The connector of claim 1, wherein the shielding element is not disposed over at least one of the contacts.

3. The connector of claim 1, wherein the housing includes a top surface arranged perpendicular to the rear surface, the plurality of contacts extend along a portion of the rear surface of the housing and the protruding portions protrude from the rear surface in a direction opposite the cavity, and the shielding element extends along the rear surface of the housing in a direction from the top surface of the housing.

4. The connector of claim 3, wherein the shielding element includes portions that terminate before reaching the protruding portions of a first subset of the contacts and includes portions that extend over the protruding portions of a second subset of the contacts.

5. The connector of claim 4, wherein the portions of the shielding element that extend over the protruding portions of the second subset of contacts are equally spaced from one another.

6. The connector of claim 4, wherein the portions of the shielding element that extend over the protruding portions of the second subset of contacts are disposed over contacts that communicate information at a higher data rate than other contacts.

7. The connector of claim 4, wherein the shielding element includes a pair of recesses located at opposite sides of each portion of the shielding element that extends over a protruding portion of a contact.

8. The connector of claim 4, wherein portions of the shielding element that terminate before reaching the protruding portions of contacts are located between portions of the shielding element that extend over protruding portions of contacts.

9. A connector comprising:
a housing defining a cavity for receiving a mating connector, the housing including a contact support member for supporting a plurality of contacts and further including a rear surface located opposite to surfaces defining the cavity;
a shielding element disposed over at least a portion of the rear surface of the housing and defining a gap between the shielding element and the housing;
a plurality of contacts, a first portion of the plurality of contacts being supported by the contact support member, and a second portion of the plurality of contacts extending adjacent the rear surface of the housing and within the gap; and
a moisture sealant disposed within the gap, the moisture sealant sealing at least portions of the gap between the contacts and the shielding element.

10. The connector of claim 9, further comprising a cap arranged between the housing and the shielding element, the cap being operable to reduce moisture ingress through the connector and insulate the contacts from the shielding element.

11. The connector of claim 10, wherein at least one of the cap and the housing includes a channel for receiving at least some of the moisture sealant.

12. The connector of claim 11, wherein the housing includes a top surface arranged perpendicular to the rear surface and an aperture for receiving the first portion of the contacts, and the channel is located between the top surface and the aperture.

13. The connector of claim 11, wherein the channel extends along a direction in which the contacts are arranged.

14. The connector of claim 11, wherein at least some of the moisture sealant is disposed within the channel.

15. An electronic device comprising:
a display for displaying information to a user;
an input element for receiving inputs from the user;
a connector for electrically connecting to other electronic devices, the connector including:
a housing defining a cavity for receiving a mating connector, the housing including a contact support member for supporting a plurality of contacts, the housing further including a rear surface located opposite to surfaces defining the cavity and a top surface arranged perpendicular to the rear surface;

a plurality of contacts supported by the contact support member, the plurality of contacts including a first portion supported by the contact support member, a second portion extending along the rear surface of the housing, and a third portion extending from the second portion in a direction away from the cavity;

a shielding element including a first portion disposed over the top surface of the housing and a second portion extending from the top surface of the housing and over the second portion of the contacts, the second portion including portions that terminate before the third portion of the contacts and including portions that extend over the third portion of the contacts; and a moisture sealant arranged between the second portion of the contacts and the shielding element, and a cap arranged between the shielding element and portions of the rear surface of the housing over which the second portion of the contacts does not extend.

16. The connector of claim 15, wherein the housing includes an aperture passing through the rear surface of the housing and the cap includes an aperture aligned with the aperture of the housing, and the aperture of the cap includes a portion sized larger than the aperture of the housing for receiving a transparent element.

17. The connector of claim 1 further comprising a moisture indicator bonded to the cap such that a surface of the moisture indicator is exposed to an aperture of the cap, the moisture indicator being operable to provide an indication of moisture infiltration in response to contact with moisture.

18. The connector of claim 17 further comprising an aperture disposed in the housing for viewing the moisture indicator via the cavity and at least one of the housing and the cap includes cutouts for holding a transparent element.

19. The connector of claim 10 further comprising a moisture indicator bonded to the cap such that a surface of the moisture indicator is exposed to an aperture of the cap, the moisture indicator being operable to provide an indication of moisture infiltration in response to contact with moisture.

20. The connector of claim 19 further comprising an aperture disposed within the shielding element for viewing the moisture indicator.

* * * * *